United States Patent
Degner et al.

(10) Patent No.: US 9,379,037 B2
(45) Date of Patent: Jun. 28, 2016

(54) THERMAL MODULE ACCOUNTING FOR INCREASED BOARD/DIE SIZE IN A PORTABLE COMPUTER

(71) Applicant: Apple Inc., Cupertino, CA (US)

(72) Inventors: Brett W. Degner, Menlo Park, CA (US); Gavin J. Reid, Campbell, CA (US); Brandon S. Smith, Mountain View, CA (US); Raymond S. Shan, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 69 days.

(21) Appl. No.: 14/214,315

(22) Filed: Mar. 14, 2014

(65) Prior Publication Data

US 2015/0262907 A1   Sep. 17, 2015

(51) Int. Cl.
| | |
|---|---|
| H05K 7/20 | (2006.01) |
| H01L 23/40 | (2006.01) |
| H05K 1/02 | (2006.01) |
| H05K 1/18 | (2006.01) |
| F28D 15/02 | (2006.01) |
| F28D 15/04 | (2006.01) |

(52) U.S. Cl.
CPC ........ H01L 23/4006 (2013.01); F28D 15/0275 (2013.01); F28D 15/04 (2013.01); H05K 1/0203 (2013.01); H05K 1/181 (2013.01); H05K 7/20336 (2013.01)

(58) Field of Classification Search
CPC .................. H05K 7/20336; H05K 7/201154; H05K 1/0203; H01L 23/427; H01L 23/4006; H01L 21/4882; H01L 23/367; F28D 15/0275
See application file for complete search history.

(56) References Cited

U.S. PATENT DOCUMENTS

| | | | |
|---|---|---|---|
| 5,262,925 A | 11/1993 | Matta et al. | |
| 5,883,783 A | 3/1999 | Turturro | |
| 6,042,388 A | 3/2000 | Tustaniwskyj et al. | |
| 6,288,895 B1 | 9/2001 | Bhatia | |
| 6,328,097 B1 | 12/2001 | Bookhardt et al. | |
| 6,353,537 B2 * | 3/2002 | Egawa | ............ 165/185 |
| 6,373,700 B1 | 4/2002 | Wang | |

(Continued)

FOREIGN PATENT DOCUMENTS

| | | |
|---|---|---|
| CN | 101484991 A | 7/2009 |
| CN | 101568247 A | 10/2009 |

(Continued)

OTHER PUBLICATIONS

International Search Report App No. PCT/US2012/033114, dated Aug. 24, 2012.

(Continued)

*Primary Examiner* — Gregory Thompson
(74) *Attorney, Agent, or Firm* — Downey Brand LLP

(57) ABSTRACT

This application relates to a low profile, small footprint cooling stack that does not extend substantially beyond a footprint of an integrated circuit to which it is affixed. The cooling stack utilizes a number of beam springs that supply a seating force to the integrated circuit by way of a metal slug. In some embodiments, a bottom surface of the metal slug can be contoured in accordance with a top surface of the integrated circuit and/or socket. In other embodiments a gap between peripheral portion of a bottom surface of the metal slug and an associated printed circuit board can be filled by a layer of foam to reduce auditory signals generated by the integrated circuit.

19 Claims, 10 Drawing Sheets

(56) References Cited

U.S. PATENT DOCUMENTS

| | | | |
|---|---|---|---|
| 6,442,026 B2 | 8/2002 | Yamaoka | |
| 6,475,011 B1 | 11/2002 | Sinha et al. | |
| 6,545,352 B1 | 4/2003 | Ruckdeschel | |
| 6,560,113 B1 | 5/2003 | Ma | |
| 6,625,022 B2* | 9/2003 | Frutschy | H01L 23/4006 165/104.33 |
| 6,639,800 B1 | 10/2003 | Eyman et al. | |
| 6,657,131 B2 | 12/2003 | Gonzalez et al. | |
| 6,658,729 B2 | 12/2003 | Brodsky | |
| 6,731,505 B1 | 5/2004 | Goodwin et al. | |
| 6,789,312 B2 | 9/2004 | White | |
| 6,859,368 B2 | 2/2005 | Yang | |
| 6,865,082 B2 | 3/2005 | Huang et al. | |
| 6,865,982 B2 | 3/2005 | Bunyard | |
| 6,885,557 B2 | 4/2005 | Unrein | |
| 6,894,908 B1 | 5/2005 | Clark et al. | |
| 7,031,162 B2* | 4/2006 | Arvelo | H01L 23/3675 257/707 |
| 7,042,727 B2 | 5/2006 | Ulen et al. | |
| 7,232,332 B2 | 6/2007 | Osborn et al. | |
| 7,245,494 B2 | 7/2007 | Cheng | |
| 7,249,954 B2 | 7/2007 | Weiss | |
| 7,262,966 B2 | 8/2007 | Liao | |
| 7,274,572 B2 | 9/2007 | Wang et al. | |
| 7,286,371 B2 | 10/2007 | Unrein | |
| 7,289,335 B2 | 10/2007 | Callahan et al. | |
| 7,293,994 B2 | 11/2007 | Brodsky et al. | |
| 7,308,931 B2 | 12/2007 | Pokharna | |
| 7,310,226 B2* | 12/2007 | Chen | H01L 23/4093 165/121 |
| 7,336,496 B1* | 2/2008 | Hsu | G06F 1/184 165/185 |
| 7,344,384 B2 | 3/2008 | Rubenstein et al. | |
| 7,382,618 B2 | 6/2008 | Peng et al. | |
| 7,436,673 B2 | 10/2008 | Wang et al. | |
| 7,474,530 B2 | 1/2009 | Stewart et al. | |
| 7,511,956 B2 | 3/2009 | Tomioka et al. | |
| 7,515,426 B2 | 4/2009 | Depew | |
| 7,518,872 B2 | 4/2009 | Tran et al. | |
| 7,619,895 B1 | 11/2009 | Wertz et al. | |
| 7,639,503 B2* | 12/2009 | Tanaka | G06F 1/203 165/185 |
| 7,656,659 B2 | 2/2010 | Cheng et al. | |
| 7,688,579 B2 | 3/2010 | Hwang et al. | |
| 7,688,587 B2 | 3/2010 | Ishikawa | |
| 7,697,288 B2 | 4/2010 | Okutsu | |
| 7,714,423 B2 | 5/2010 | Reid et al. | |
| 7,766,691 B2 | 8/2010 | Pandey et al. | |
| 7,777,329 B2 | 8/2010 | Colbert et al. | |
| 7,795,724 B2 | 9/2010 | Brodsky et al. | |
| 7,830,665 B2 | 11/2010 | Lin | |
| 7,894,183 B2 | 2/2011 | Chen et al. | |
| 7,948,754 B2 | 5/2011 | Huang | |
| 7,957,148 B1 | 6/2011 | Gallarelli et al. | |
| 8,305,761 B2 | 11/2012 | Degner et al. | |
| 8,520,393 B2 | 8/2013 | Homer et al. | |
| 8,619,420 B2 | 12/2013 | Degner et al. | |
| 8,908,373 B2* | 12/2014 | Sakamoto | H01L 23/427 165/104.26 |
| 9,013,869 B2 | 4/2015 | Degner et al. | |
| 2003/0019097 A1 | 1/2003 | White | |
| 2005/0068740 A1 | 3/2005 | Ulen et al. | |
| 2006/0044764 A1 | 3/2006 | Kuang et al. | |
| 2006/0102323 A1 | 5/2006 | Ghosh | |
| 2007/0121291 A1 | 5/2007 | Wang et al. | |
| 2007/0127210 A1 | 6/2007 | Mahalingam | |
| 2007/0236887 A1* | 10/2007 | Cheng | H01L 23/4006 361/700 |
| 2008/0013825 A1* | 1/2008 | Nagatsuka | B25J 9/1671 382/153 |
| 2008/0130231 A1 | 6/2008 | Chen | |
| 2008/0180915 A1 | 7/2008 | Lin | |
| 2008/0212289 A1 | 9/2008 | Lin | |
| 2009/0004902 A1 | 1/2009 | Pandey et al. | |
| 2009/0103262 A1 | 4/2009 | Hata | |
| 2009/0142956 A1 | 6/2009 | Ma | |
| 2009/0201646 A1 | 8/2009 | Yang et al. | |
| 2009/0311885 A1* | 12/2009 | Cheng | G06F 1/20 439/65 |
| 2010/0020501 A1* | 1/2010 | Li | H01L 23/4006 361/710 |
| 2010/0177477 A1 | 7/2010 | Cheng et al. | |
| 2010/0238631 A1 | 9/2010 | Kuo et al. | |
| 2013/0094141 A1 | 4/2013 | Degner et al. | |

FOREIGN PATENT DOCUMENTS

| | | |
|---|---|---|
| CN | 201436705 U | 4/2010 |
| KR | 1020090011242 | 2/2009 |

OTHER PUBLICATIONS

Written Opinon App No. PCT/US2012/033114, dated Aug. 24, 2012.

Chinese Application No. 201280031799.X—First Office Action dated Jan. 13, 2016.

Korean Patent Application No. 10-2014-7002253—Preliminary Rejection dated Jun. 26, 2015.

* cited by examiner

THERMAL MODULE ACCOUNTING FOR INCREASED BOARD/DIE SIZE IN A PORTABLE COMPUTER

FIELD

The described embodiments relate generally to methods for removing heat from integrated circuits within compact computing device housings. More particularly, the present embodiments relate to low profile heat removal device.

BACKGROUND

Integration of graphics processing units and central processing units into a single integrated circuit package has caused substantial increases in die sizes. In most computing devices, integrated circuits require some kind of cooling component to dissipate heat from the integrated circuits. Components for attaching cooling component to the integrated circuit can cause substantial increases in a stack height above the integrated circuit. While this may not be problematic in more traditional tower or desktop computing applications, impact upon a slim form factor of portable computing devices can be quite problematic. While some solutions have been utilized that reduce an overall stack height above the integrated circuit, these solutions tend to require additional board area. Unfortunately, when the printed circuit board to which the integrated circuit is mounted has a high packing density, board space for such a mounting component may not be available.

Therefore, what is desired is a low profile, small footprint cooling stack.

SUMMARY

This paper describes various embodiments that relate to a low profile, small footprint cooling stack.

A cooling stack for removing heat from an integrated circuit mounted on a printed circuit board (PCB) is disclosed. The cooling stack includes at least the following: a metal slug including a top surface and a channel arranged along the top surface; a heat pipe disposed within and coupled to the channel of the metal slug; a beam spring exerting a force directly to the top surface of the metal slug; and a number of fasteners, each of the fasteners configured to fasten an end of the four point beam spring to a fastening feature disposed next to a periphery of the integrated circuit.

A heat removal system configured to transfer heat generated by an operating component to the external environment is disclosed. The heat removal system including at least the following: a slug having a bottom surface in contact with a top surface of the operating component, the slug including a channel disposed along a top surface of the slug and extending from a first side of the slug to a second side of the slug, the second side opposite the first side; a heat pipe disposed within the channel, the heat pipe comprising lateral surfaces coupled to sidewalls defining the channel; and a number of beam springs configured to exert a force on the operating component by way of the slug, each of the beam springs having a first end and a second end, the first end coupled to a securing feature disposed proximate the first side of the slug and the second end coupled to a securing feature disposed proximate the second side of the slug.

A portable computing device is disclosed. The portable computing device includes at least the following: a printed circuit board (PCB); a plurality of fastening features coupled to a top surface of the PCB; an integrated circuit electrically coupled to the top surface of the PCB by a socket; a metal slug in direct contact with a top surface of the integrated circuit; a beam spring coupled to the top surface of the PCB by a number of fasteners that engage corresponding ones of the fastening features and exerting a seating force on the integrated circuit by way of the metal slug; and a heat pipe disposed within a channel arranged along a top surface of the metal slug, the heat pipe including lateral surfaces soldered to sidewalls defining the channel.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1:
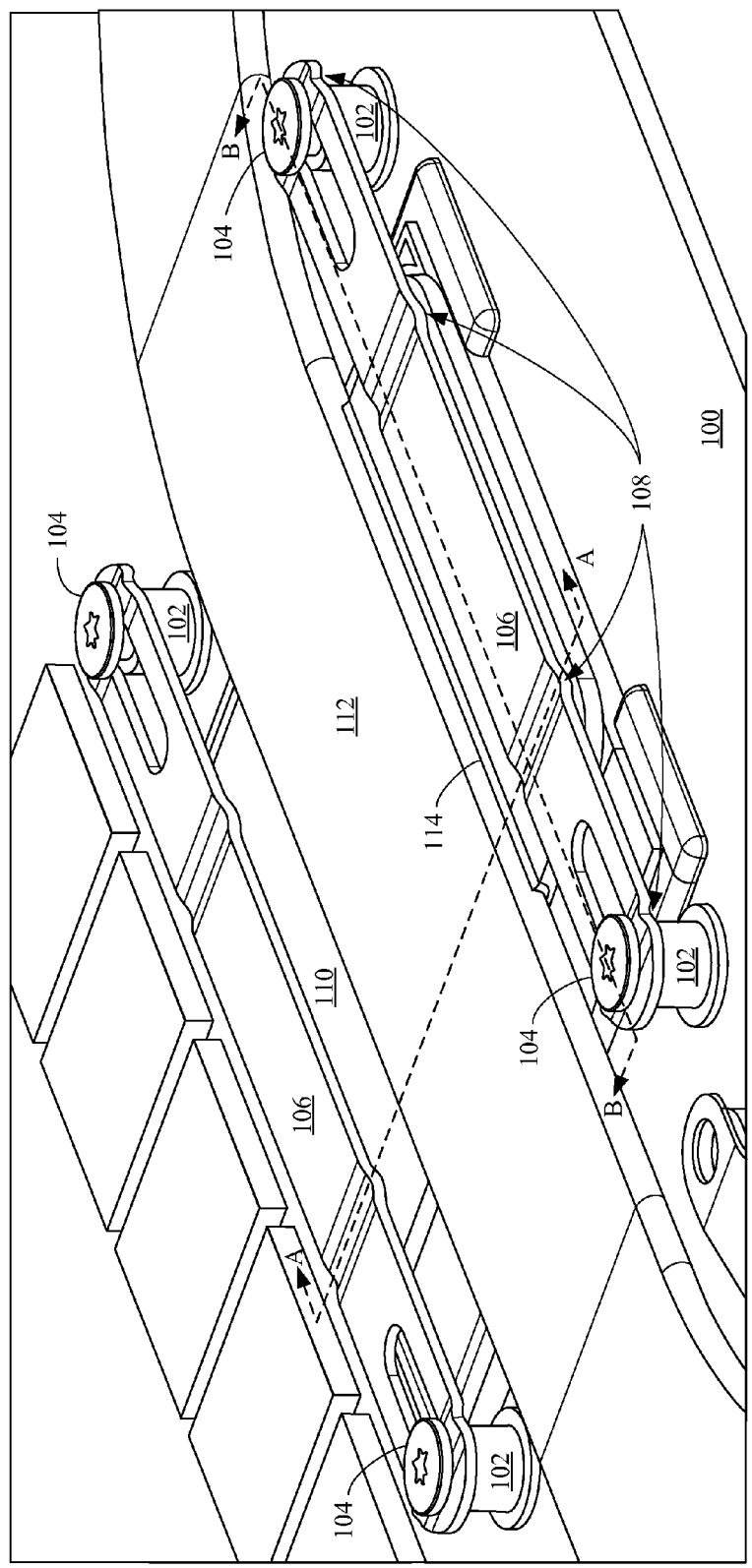
FIG. 1 shows a perspective view of an exemplary cooling stack suitable for use with a portable computing device.

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

A cooling mechanism is used to keep electrical components within safe operating limits by removing waste heat. In some cases a Central Processing Unit (CPU) alone needs a substantial amount of power that must be dissipated to keep the CPU operating within normal operating parameters. The cooling mechanism generally includes at least one of a number of heat removal components including: heat sinks; fans; water cooling; heat pipes; or phase change cooling. While some computing device designs have sufficient space for a large heat removal component or components for heat removal, smaller devices may not have room for relatively large heat rejection components. In addition to size taken up by the cooling components themselves, mounting components can also occupy substantial room. Some integrated circuits require a substantial amount of force to properly seat pins of the integrated circuit within a socket. A cantilevered beam spring can be configured to couple heat removal components to an integrated circuit without adding substantially to a height of the integrated circuit. Unfortunately, a force provided by a cantilevered beam spring is directly proportional to a length of the cantilevered beam spring. For this reason, while the cantilevered beam spring can provide a low profile structure for applying force to the integrated circuit the mounting structure can extend well outside of a footprint of the integrated circuit to provide a requisite amount of force for seating the integrated circuit.

In one embodiment, a cantilevered beam spring can extend across the integrated circuit itself. In this way, the length of the cantilevered beam spring can be substantially contained within a footprint of the integrated circuit, thereby increasing an amount of force that can be provided by a cantilevered beam spring disposed within a constrained footprint. This configuration provides a number of advantages over a more traditional arrangement. First, an overall footprint is substantially reduced when compared with a configuration in which the cantilevered beam springs are outboard of the integrated circuit. Second, by locating mounting points closer to the integrated circuit a moment exerted upon the PCB is substantially less, thereby reducing an amount of strain experienced by the PCB. Third, when a four-point spring is utilized, a force exerted upon the integrated circuit by the cantilevered beam spring is self-leveling, substantially preventing irregular force distribution upon the integrated circuit. Fourth, in some embodiments, the cantilevered beam spring can be configured so that it does not extend above other cooling components preventing the cantilevered beam spring from adding height to a cooling stack (sometimes referred to as a heat removal system) associated with the integrated circuit. Finally, since an amount of force applied by the beam spring varies substantially linearly with an amount of bending of the beam spring, tuning the amount of force applied to the die can be accomplished by for example, increasing a height of the standoffs or changing a geometry or shape of the spring. For example, by increasing a curvature of the beam spring an amount of force exerted by the spring when flattened generally increases.

These and other embodiments are discussed below with reference to FIGS. 1-9; however, those skilled in the art will readily appreciate that the detailed description given herein with respect to these figures is for explanatory purposes only and should not be construed as limiting.

FIG. 1 shows a perspective view of a cooling stack in accordance with the described embodiments. The cooling stack is mounted upon printed circuit board (PCB) 100. Standoffs 102 are mounted directly to PCB 100. Standoffs 102 can be coupled to PCB 100 in any number of ways including by soldering, or even screwing standoffs 102 to PCB 100. Standoffs 102 are configured to receive fasteners 104. Fasteners 104 are configured to engage standoffs 102 to secure cantilevered beam springs 106 a fixed distance above PCB 100, the fixed distance defined by standoffs 102. In some embodiments, cantilevered beam springs 106 can be formed of precipitation hardened steel. Formation of beam springs 106 from precipitation hardened steel can increase an amount of pressure provided by beam springs 106 for a given lever arm length. Each of beam springs 106 can include a number of stress concentration features 108 configured to contact slug 110 and fastens 104 at predetermined positions. The depicted beam springs 106 are four point beam springs. Two of the points facilitate even engagement of a head portion of fasteners 104 with outer stress concentrators 108 of beam spring 106. The other two points of contact are between a top surface of slug 110 and centrally disposed beam concentrators 108. In this way a force distribution across slug 110 can be consistently applied to an integrated circuit disposed below slug 110.

Slug 110 can be formed from a highly conductive material such as copper. In some embodiments, a copper alloy made from about 98% copper can be utilized, imparting a high thermal conductivity to slug 110. Slug 110 can be further configured to conduct thermal energy from the integrated circuit to a heat distribution member. In one embodiment, as depicted, the heat distribution member is embodied as heat pipe 112. Heat pipe 112 in turn is configured to conduct heat away from the integrated circuit. In some embodiments, each end of heat pipe 112 can be in thermally conductive contact with an array of cooling fins across which the transported heat is dissipated. Heat pipe 112 can be coupled with slug 110 by soldering heat pipe 112 to slug 110 at solder joint 114. In some embodiments, solder joint 114 can include solder solids to enhance a robustness of solder joint 114. This can be especially helpful to protect a thinned portion of slug 110 from experiencing a bending force that would cause the thinned portion to break of deform. Solder joints 114 essentially joins lateral edges of the heat pipe and curved sidewalls of the channel formed in the slug to reinforce the thinned portions of slug 110 under loading conditions.

Figure 2:
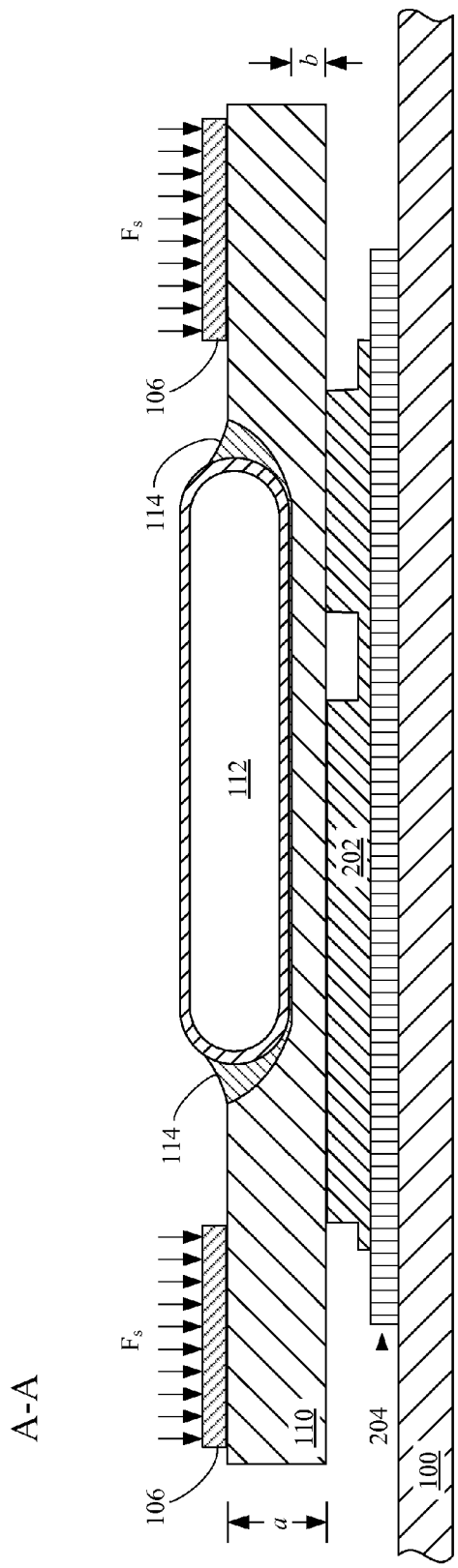
FIG. 2 shows a cross-sectional view of the cooling stack of FIG. 1.

FIG. 2 shows a cross-sectional side view of the cooling stack depicted in FIG. 1 in accordance with section line A-A. FIG. 2 depicts how slug 110 interacts with integrated circuit 202. Beam springs 106 apply a seating force to die 202 through or by way of slug 110. In this way, connectors disposed along a bottom surface of die 202 can be electrically and mechanically coupled with PCB 100 by attachment layer 204. Attachment layer 204 can be any suitable attachment mechanism. For example, in some embodiments attachment layer 204 can be a socket with electrical contacts or in other embodiments die 202 can be SMT'd directly to PCB 100. In one particular embodiment, attachment layer 204 can be a ball grid array coupling connector pins of die 202 to electrical traces disposed upon PCB 100. Slug 110 In some embodiments, slug 110 can have a channel, which allows heat pipe 112 to be in closer proximity to die 202. The channel is also operable to prevent heat pipe 112 from adding to an overall height of the cooling stack. In one particular embodiment, an overall height b of slug 110 can be about 0.8 mm while a height a of a portion of the slug disposed between heat pipe 112 and die 202 can be about 0.25 mm. Solder joint 114 is also visible in this depiction. By including the aforementioned solder solids in the formation of solder joint 114, adhesion between heat pipe 112 and slug 110 can be improved. Solder joint 114 also allows heat pipe 112 to reinforce a structural integrity of slug 110.

Figure 3:
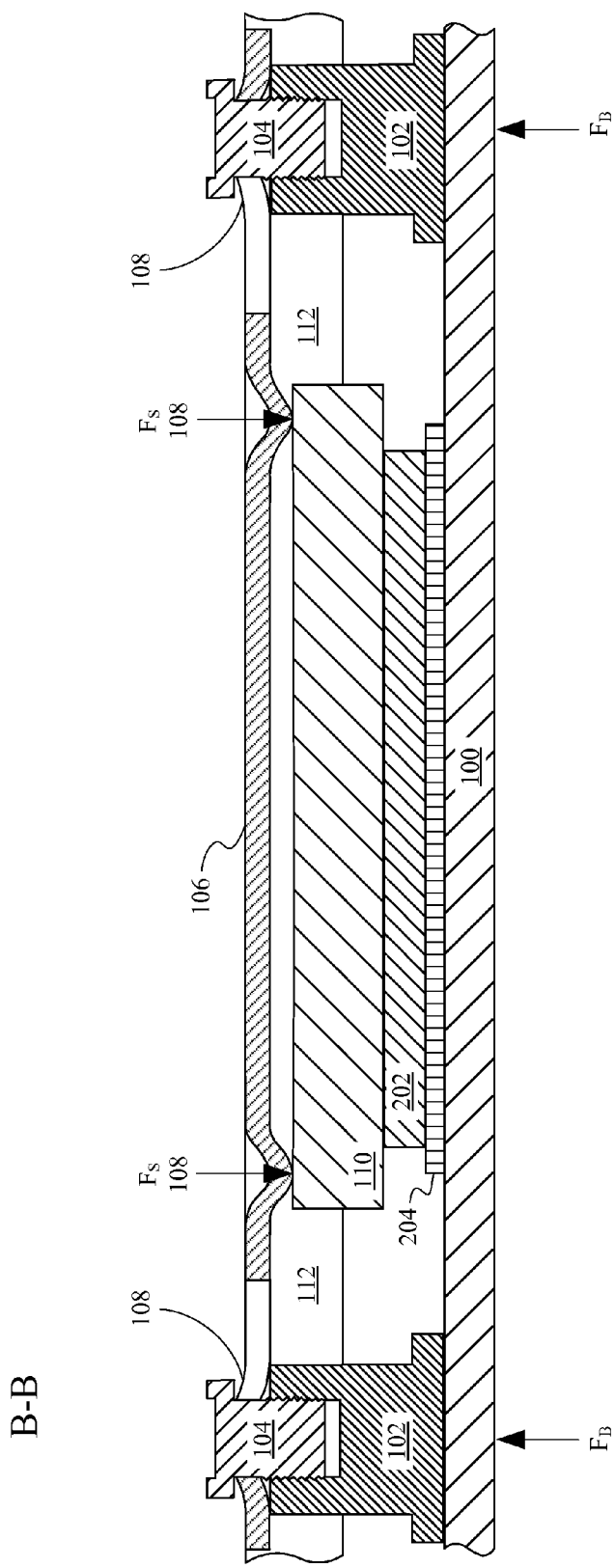
FIG. 3 shows another cross-sectional view of the cooling stack of FIG. 1.

FIG. 3 shows a cross-sectional side view of the cooling stack depicted in FIG. 1 in accordance with section line B-B. In this view, a force distribution diagram is depicted showing forces $F_S$ applied by beam spring 106 through stress concentrators 108 and forces $F_B$ applied through stand offs 102. Because the effective lever arm of beam spring 106 extends over die 202 and attachment layer 204, the standoffs 102, which apply force $F_B$ to PCB 100, can be in close proximity to a peripheral edge of attachment layer 204. In this way, a moment applied to PCB 100 can be minimized, thereby reducing an amount of flex placed upon PCB 100. A reduction in stress to PCB 100 can prevent early failure of PCB 100 or in some cases allow a thinner or less expensive PCB design to be used, thereby saving vertical height and/or money on fabrication of PCB 100. It should also be noted that a curvature of stress concentrators 108 associated with fasteners 104 remove any influences on moments that could be due to a head portion of one of fasteners 104 engaging one side of beam spring 106 before another side. The curvature of stress concentrators 108 associated with fasteners 108 helps to allow fasteners 104 to concurrently engage both sides of the head portion during an attachment operation. This configuration also keeps an effective beam length or lever arm associated with beam spring 106 substantially constant while fasteners 104 engages standoffs 102. Furthermore, in some embodiments, this configuration allows an engagement height of fasteners 104 to beam spring 106 to be adjusted without making design changes to beam springs 106. Because the lever arms remain substantially constant some reductions and increases in engagement height can provide changes to an amount of force applied to die 202 without making substantial design changes to the cooling stack components. For example, this can be particularly advantageous in rework situations where in one case where it is subsequently determined increased force would allow increased thermal dissipation, or in another case where it is subsequently determined that the PCB is overstressed by the cooling stack.

Figure 4:
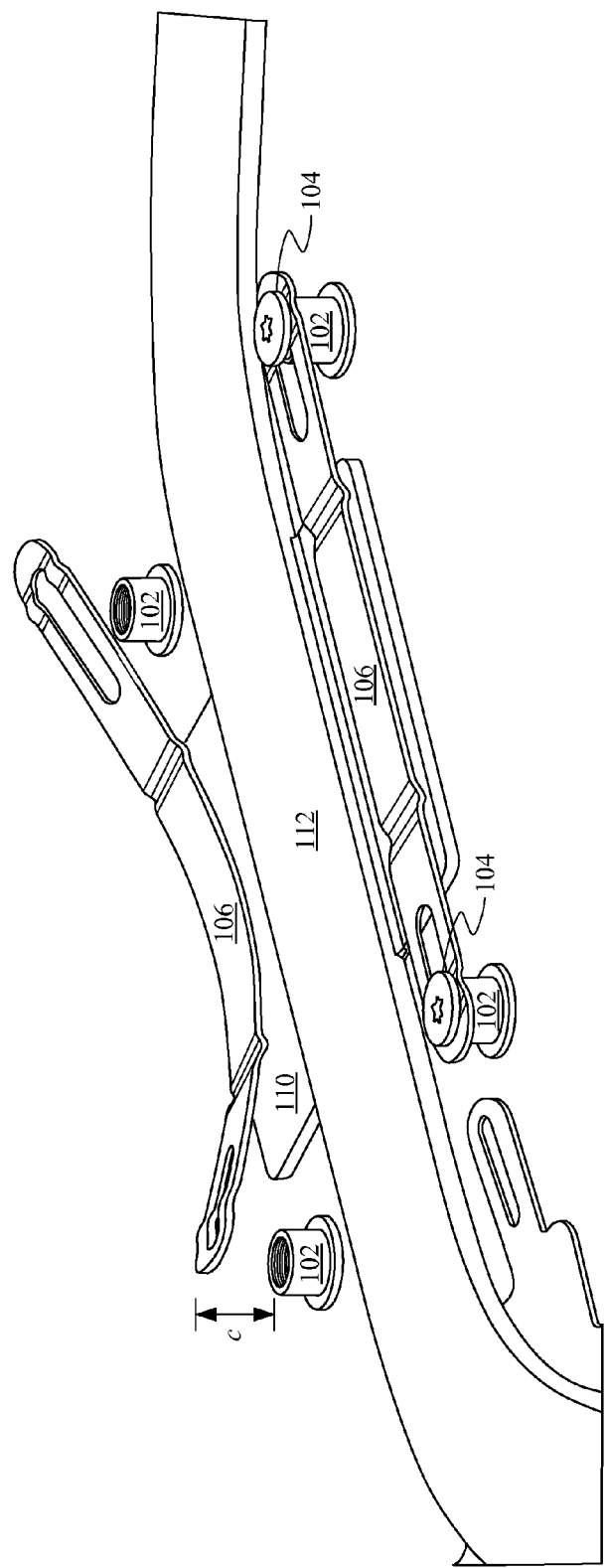
FIG. 4 shows a perspective view of another cantilevered spring prior to compressing the spring against the cooling stack.

FIG. 4 shows a perspective view of a partially assembled cooling stack. To provide a comparison between pre-bent and bent states of beam springs 106, one of beam springs 106 is shown attached to standoffs 102, while the other beam spring 106 is shown in a pre-bent state before being attached to corresponding standoffs 102. Generally both beam springs 106 are concurrently coupled with slug 110 to prevent an application of asymmetric force to die 202 (not shown) by way of slug 110. One end of pre-bent beam spring 106 can be positioned a distance c above a top surface of corresponding standoffs 102. In one specific embodiment, distance c can be about three millimeters. By deforming each end of beam spring 106 a distance c and securing the ends to corresponding standoffs 102, beam spring 106 can apply a predetermined amount of force to slug 110.

Figure 5:
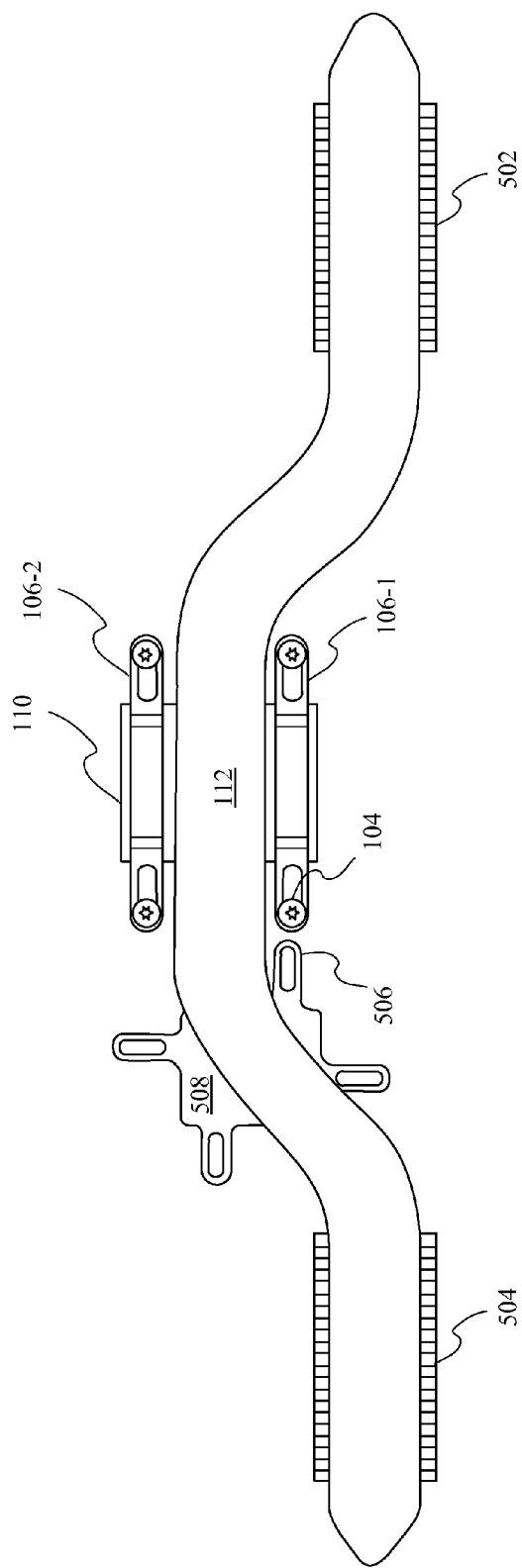
FIG. 5 shows a top view of a heat pipe configured to draw heat away from a number of heat emitting components.

FIG. 5 shows a top view of one particular configuration of a cooling stack in contact with a heat pipe 112. Opposing ends of heat pipe 112 are in contact with fin stack 502 and fin stack 504. In some embodiments, cooling fans can be configured to force air across fin stacks 502 and 504. FIG. 5 also depicts how beam spring 106-1 has very little clearance from protrusion 506 of heat sink 508. In this way, a reduced size foot print of the depicted cooling stack provided by this particular configuration allows an integrated circuit associated with the cooling stack to be in close proximity to another integrated circuit associated with heat sink 508.

Figure 6A:
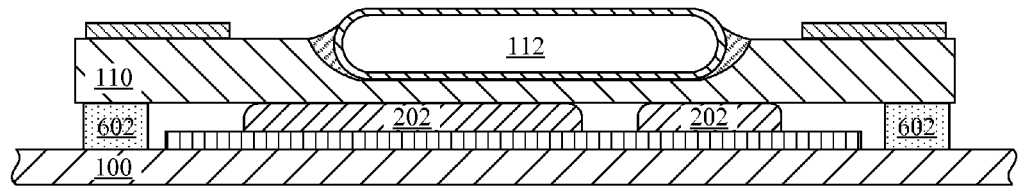
FIGS. 6A-6C show cross-sectional side views of various cooling stack embodiments.
Figure 6B:
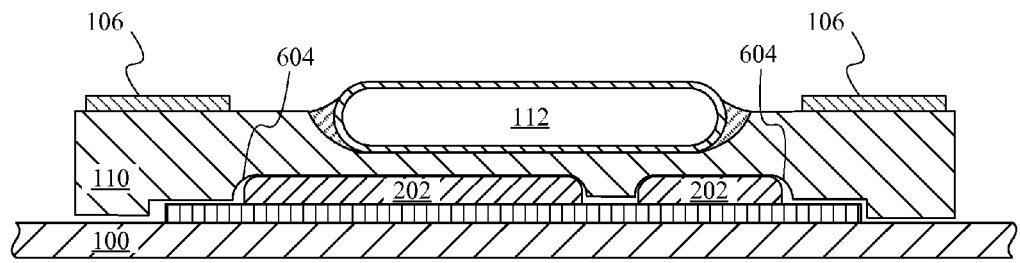
Figure 6C:
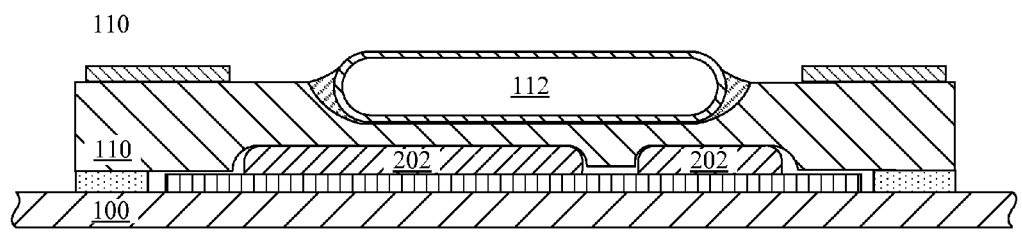

FIGS. 6A-6C show cross-sectional side views of a number of alternative configurations of a cooling stack. FIG. 6A shows a configuration in which the cooling stack includes insulation to reduce an auditory output of die 202. This auditory output reduction can be particularly helpful when die 202 includes high frequency switching components, such as a voltage regulator with a high frequency switching component. In some embodiments, the insulation can be formed from conductive foam 602 and positioned between a bottom peripheral surface of slug 110 and a top surface of PCB 100. Conductive foam 602 can cooperate with slug 110 to surround die 202, thereby preventing or at least subduing an amount of sound emitted from the cooling stack. The conductive foam 602 can also be configured to create a faraday cage around die 202 when it is grounded to a top surface of PCB 100. In this way, in addition to reducing a volume of sound output from the cooling stack, die 202 can be electrically isolated from other electrical components proximate the cooling stack.

FIG. 6B shows how slug 110 can be shaped to conform with a top surface of die 202. One set of features that can be added to slug 110 during a forming operation are cavities 604 that are complementary to protrusions of die 202. When cavities 604 conform to a top shape of die 202, thermal conduction of heat from die 202 to slug 110 can be increased since a larger amount of surface area of slug 119 contacts die 202. In addition to increasing heat transfer, the conformal features of slug 119 can also be operable to align slug 119 to die 202. In this way misalignment of slug 119 with respect to die 202 can be avoided. Because die 202 is located in a predetermined position by virtue of a fixed position of attachment layer 204, the alignment of slug 110 with die 202 allows beam springs 106 to contact slug 110 at known positions. Another advantage of the embodiment displayed in FIG. 6B is that a volume of slug 119 can be increased allowing slug 119 to distribute received heat across a larger volume. In this way, slug 119 can be configured to store a relatively larger amount of heat at a given overall temperature. In this way, a temperature differential between die 202 and slug 119 can be maintained for a longer period of time, allowing efficient transfer of heat from die 202 to slug 110 for a longer period of time. Finally FIG. 6C shows yet another alternative embodiment in which slug 119 is shaped to conform with die 202 and includes a conductive foam 202 that provides both auditory and electrical isolation of die 202 from a surrounding system. In this way, the advantages of FIGS. 6A and 6B can be included in a single embodiment.

Figure 7A:
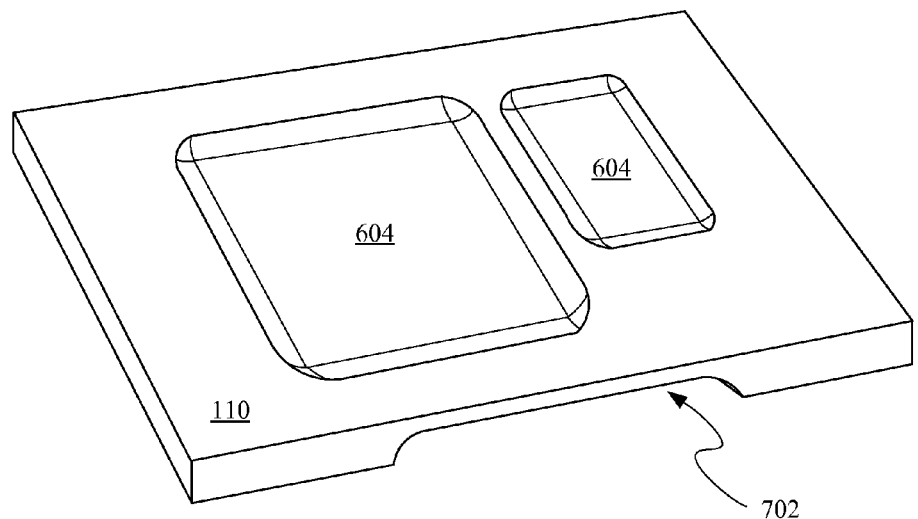
FIGS. 7A-7B show perspective views of a bottom surface of the slug depicted in FIGS. 6B and 6C.
Figure 7B:
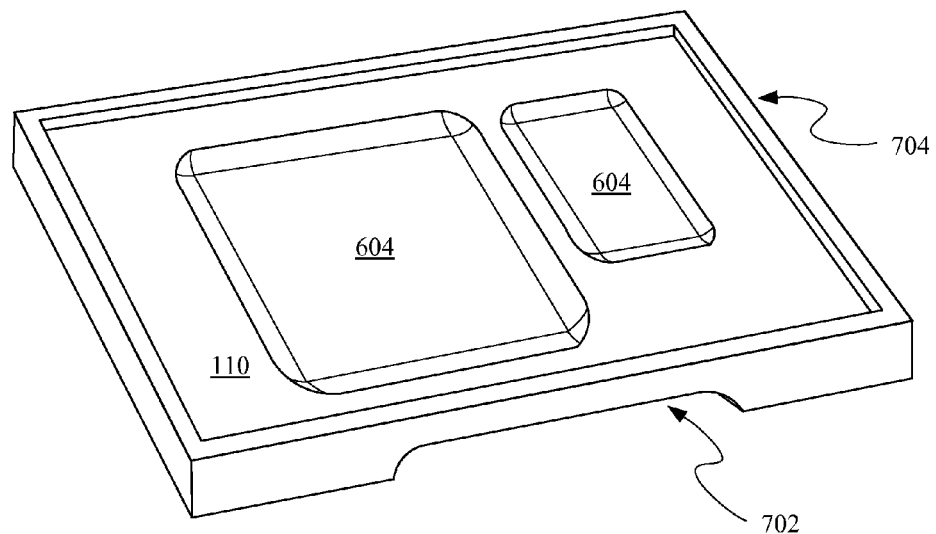

FIG. 7A shows a bottom perspective view of slug 110 in accordance with the embodiment depicted in FIG. 6C. A bottom surface of slug 110 defines cavities 604 that can have a geometry complementary to a top surface of die 202 (not shown). Slug 110 can be formed in a number of ways. In one embodiment slug 110 can be formed from a single metal block. Cavities 604 can be machined from a bottom surface of slug 110 and channel 702 (associated with heat pipe 112) can be machined from a top surface of slug 110. FIG. 7B shows an embodiment in accordance with the embodiment depicted in FIG. 6B. Here a ridge 704 is left along a periphery of slug 110. In some embodiments, ridge 704 can be positioned outside of a footprint of a socket to which the die is electrically coupled.

FIGS. 8A-8E show cross-sectional side views of a cooling stack during an assembly operation in which a fixturing device positions, bends and secures beam springs against a slug portion of the cooling stack. Fixturing device 800 includes body portion 802. Body portion 802 has curved portion 804 disposed along a bottom portion of body portion 802. In some embodiments, as depicted, curved portion 804 can have a curvature in accordance with an unbent geometry of beam spring 106. Curved portion 804 includes magnetic elements 806 which can be configured to retain beam spring 106 against an outside surface of curved portion 804. In some embodiments magnetic elements 806 can be electro magnets so that fixturing device 800 can pick up and put down beam springs 106 when desired. In other embodiments magnetic elements 806 can be permanent magnets along the lines of neodymium magnets. Curved portion 804 also includes a number of plungers 808 disposed within a channel extending into body portion 802. It should be noted that while not depicted fixturing device 800 can be configured to install two or more beam springs 106 concurrently.

Figure 8A:
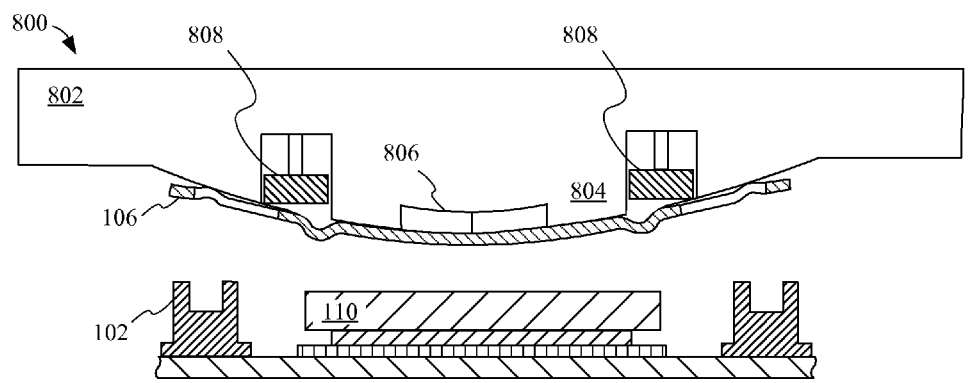
FIGS. 8A-8E show cross-sectional side views of a fixture configured to concurrently install two beam springs against a slug component.
Figure 8B:
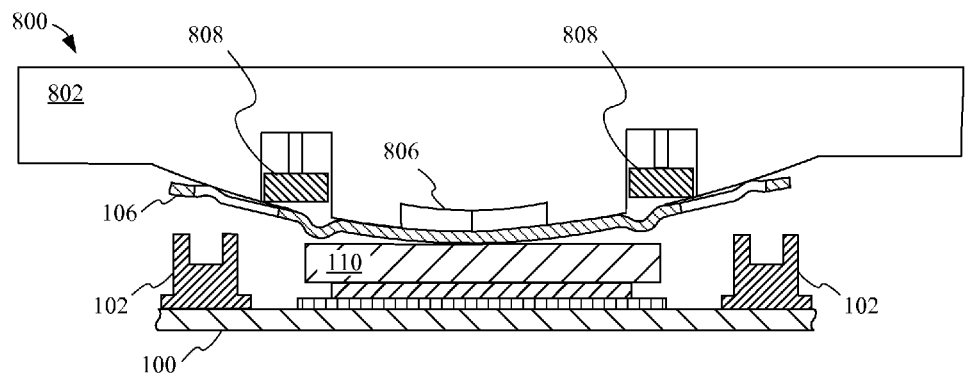
Figure 8C:
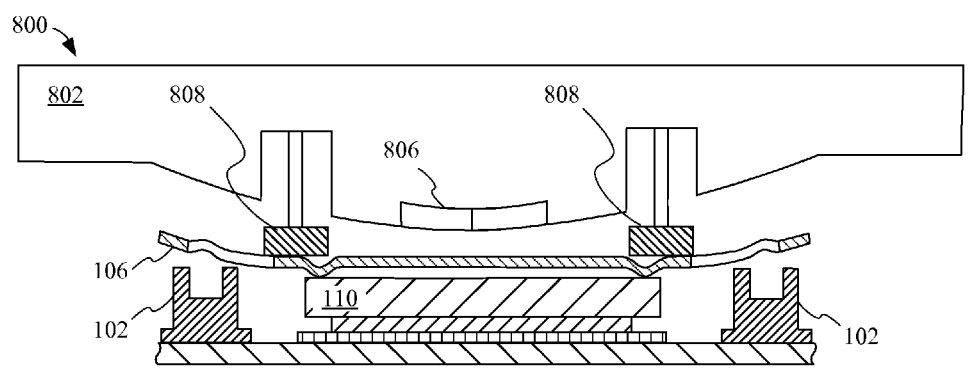
Figure 8D:
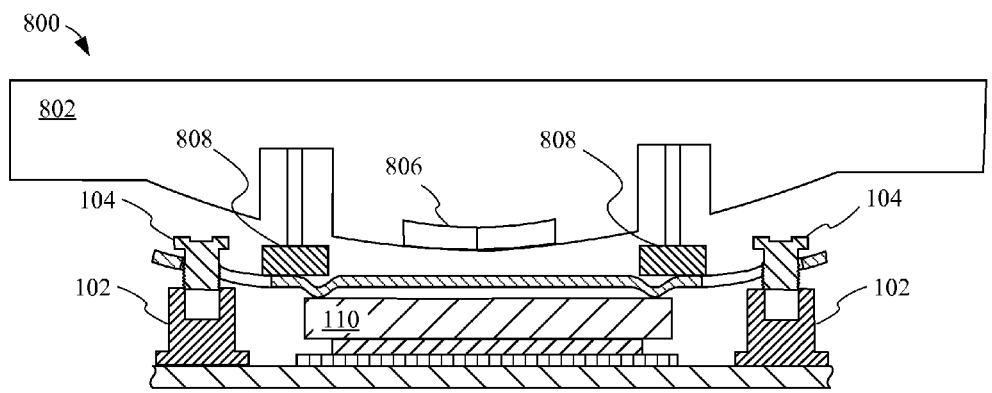
Figure 8E:
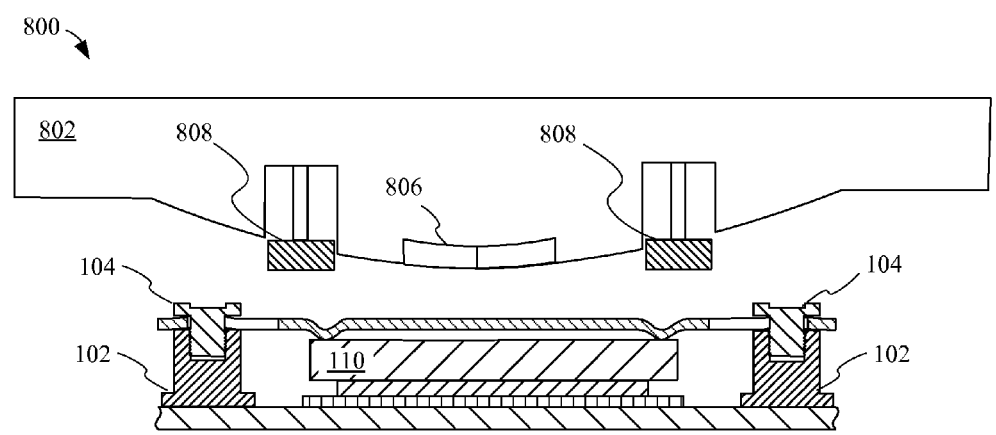

In FIG. 8A fixturing device 800 is depicted positioning a beam spring 106 above slug 110 so that openings in beam spring 106 line up with threaded openings in standoffs 102. In FIG. 8B fixturing device 806 places a bottom surface of beam spring 106 in contact with or at least in close proximity to a top surface of slug 110. In FIG. 8C plungers 808 are depicted as having moved from the retracted position shown in FIGS. 8A-8B to an extended position. By extending plungers 808 and drawing body portion 802 away from slug 110, plungers 808 can begin bending beam spring 106 into position against slug 110 and magnetic elements 806 and beam spring 106 can be decoupled. It should be noted that ends of beam spring 106 can retain a slight curvature at this point in an assembly process. In FIG. 8D fasteners 104 are depicted being inserted through openings in beam spring 106. The openings in beam spring 106 can be longer than a diameter of fasteners 104 so that fasteners 104 can have a wider tolerance for insertion within the openings. Furthermore, since four point beam spring 104 is self-leveling, its use precludes force distribution irregularities when beam spring 106 is slightly misaligned. Finally in FIG. 8E fasteners 104 are shown full engaged with standoffs 102. In some embodiments fixturing device 800 can include drivers for engaging fasteners 104 with standoffs 102, while in other embodiments a separate driver can be applied to engage fasteners 104 with standoffs 102. In this way, beam spring 106 can be fully engaged with slug 110 and substantially parallel with a top surface of slug 110. In some embodiments, an amount of force exerted by fasteners 104 can be reduced by backing fasteners slightly away from a top surface of beam spring 106, thereby beam spring 106 to retain a slight bend. In other embodiments, a height of standoffs 102 can be adjusted to change an amount of force applied when fasteners 104 are fully engaged against standoffs 102. Plungers 808 are shown partially retracted as body portion 802 extends farther above the assembled cooling stack.

Figure 9:
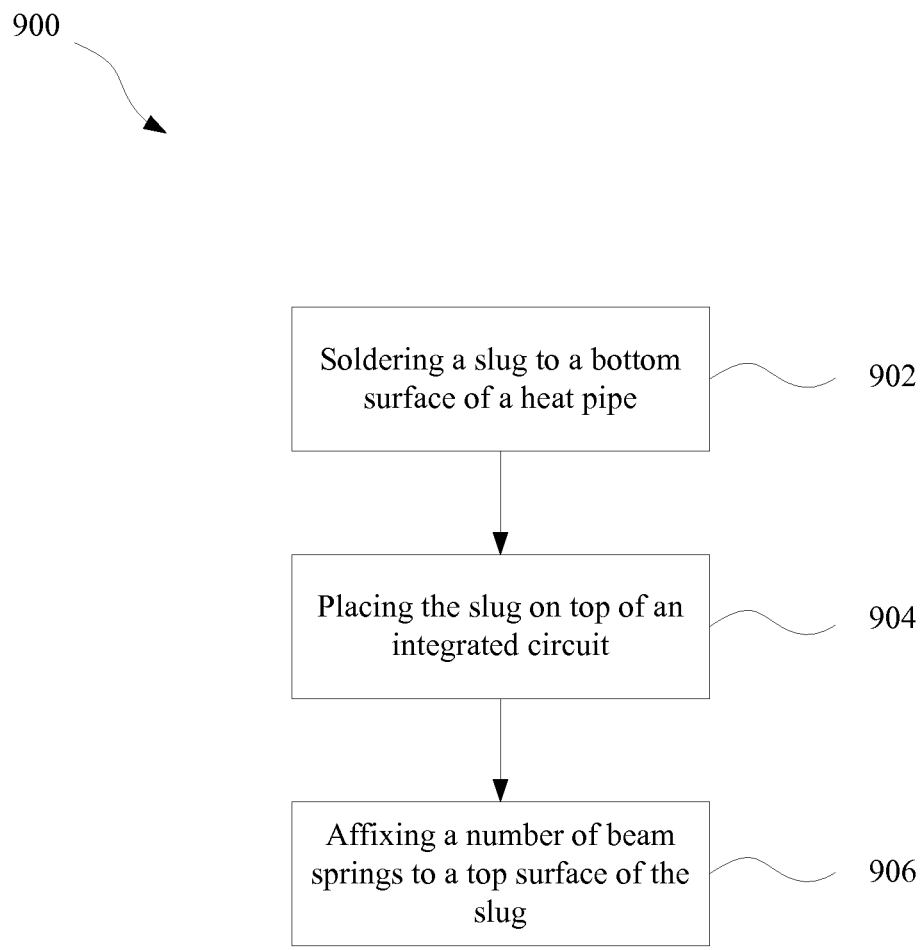
FIG. 9 shows a block diagram representing a method for assembling a cooling stack.

FIG. 9 shows a block diagram representing a number of steps in a method for assembling a cooling stack. In a first step 902, a heat pipe is soldered to a channel disposed along a top surface of a slug. A joint between the slug and the heat pipe can be reinforced by adding solder solids to the joint during the soldering operation. In step 904 the slug is placed in direct contact with a top surface of an integrated circuit. In some embodiments, a layer of thermal grease can be disposed between the integrated circuit and the heat pipe to facilitate the conduction of heat between the integrated circuit and the heat pipe. It should be noted that when the heat pipe is said to be in direct contact with the slug, an intervening layer of thermal grease can be present between the integrated circuit and the heat pipe. In step 906 a number of beam springs are pressed against a top surface of the slug. Distal ends of the beam springs can be fastened to a top surface of a printed circuit board (PCB) to which the integrated circuit is attached. Fastening the ends of the beam springs to the PCB causes the beam springs to deform changing from a bent state to a substantially flat state. While fixed to the PCB the beam springs exert a force to the top surface of the slug that causes the slug to be compressed against the integrated circuit, thereby minimizing a thickness of a layer of thermal grease disposed between the integrated circuit. The force compressing the integrated circuit and the die helps to increase an efficiency of heat transfer between the two components. In this way the assembled cooling stack can both remove heat from the integrated circuit by way of the slug and heat pipe, and provide the force to improve thermal efficiency of the cooling stack. In certain embodiments, the force can also assist in electrically coupling the integrated circuit when the integrated circuit is coupled to the PCB by a socket.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A cooling stack for removing heat from an integrated circuit mounted on a printed circuit board (PCB), the cooling stack comprising:
   a metal slug comprising a top surface and a channel arranged along the top surface;
   a heat pipe disposed within and coupled to the channel of the metal slug;
   a beam spring exerting more than one force to the metal slug by way of respective more than one stress concentrator features formed in and that protrude from the beam spring and directly contacting the top surface of the metal slug; and
   fasteners configured to fasten an end of the beam spring to a fastening feature disposed proximate to a periphery of the integrated circuit
   wherein the beam spring compresses the metal slug against the integrated circuit.

2. The cooling stack as recited in claim 1, wherein the beam spring is oriented substantially parallel to the heat pipe.

3. The cooling stack as recited in claim 1, wherein the heat pipe is welded to the metal slug and wherein weld joints are positioned between lateral surfaces of the heat pipe and sidewalls of the channel.

4. The cooling stack as recited in claim 3, wherein the weld joints between the heat pipe and metal slug are formed at least in part by solder solids.

5. The cooling stack as recited in claim 1, wherein a peripheral portion of a bottom surface of the slug is coupled with a layer of foam that substantially prevents noise emitted from the integrated circuit from leaving the cooling stack.

6. The cooling stack as recited in claim 1, wherein a top surface of the beam spring does not extend above a top surface of the heat pipe.

7. The cooling stack as recited in claim 1, wherein the beam spring comprises a first beam spring, wherein a second beam spring exerts forces directly to the top surface of the metal slug by way of respective stress concentrator features formed in and that protrude from the second beam spring, and wherein the first beam spring and the second beam spring are disposed on opposite sides of the top surface of the metal slug.

8. The cooling stack as recited in claim 1, wherein a bottom surface of the slug is in direct contact with a top surface of the integrated circuit.

9. The cooling stack as recited in claim 8, wherein the bottom surface of the slug includes cavities having a size and shape in accordance with the top surface of the integrated circuit, and wherein the cavities cooperates with a protrusion of the integrated circuit to align the slug with the integrated circuit.

10. A heat removal system configured to transfer heat generated by an operating component to the external environment, the heat removal system comprising:
    a slug having a bottom surface in contact with a top surface of the operating component, the slug comprising a channel disposed along a top surface of the slug and extending from a first side of the slug to a second side of the slug, the second side opposite the first side;
    a heat pipe disposed within the channel, the heat pipe comprising lateral surfaces coupled to sidewalls defining the channel; and
    beam springs each configured to exert a force on the operating component by way of the slug, each of the beam springs comprising:
        a first end and a second end, the first end coupled to a securing feature disposed proximate the first side of the slug and the second end coupled to a securing feature disposed proximate the second side of the slug; and
        more than one stress concentrators formed in and that protrude from the beam spring configured to directly contact the slug and for applying more than one respective forces to the slug to restrain the slug against the operating component.

11. The heat removal system as recited in claim 10, wherein the slug is formed of a copper alloy.

12. The heat removal system as recited in claim 10, wherein each of the stress concentrators extends towards the slug.

13. The heat removal system as recited in claim 10, wherein a thickness of the slug within the channel is less than half a thickness of a remaining portion of the slug, wherein the lateral surfaces are coupled to the sidewalls of the channel by solder joints and wherein the coupling provided by the solder joints helps provide structural reinforcement to the portion of the slug associated with the channel.

14. The heat removal system as recited in claim 10, wherein the beam springs exert a force to the operating component by way of the metal slug to seat the operating component in a socket.

15. A portable computing device, comprising:
    a printed circuit board (PCB);
    a plurality of fastening features coupled to a top surface of the PCB;
    an integrated circuit electrically coupled to the top surface of the PCB by a socket;
    a metal slug in direct contact with a top surface of the integrated circuit;
    a beam spring coupled to the top surface of the PCB by fasteners that engage corresponding fastening features and exerting a seating force on the integrated circuit by way of the metal slug; and
    a heat pipe disposed within a channel disposed along a top surface of the metal slug, the heat pipe comprising lateral surfaces soldered to sidewalls defining the channel
    wherein the beam spring exerts forces to the slug by way of a respective more than one stress concentrator features formed in and that protrude from the beam spring, the beam spring compressing the metal slug against the integrated circuit.

16. The portable computing device as recited in claim 15, wherein a bottom surface of the metal slug is complementary to a geometry of both a top surface of the integrated circuit and a top surface of the socket.

17. The portable computing device as recited in claim 15, wherein the bottom surface of the slug comprises a cavity that engages a protrusion of the integrated circuit, and wherein interaction between the protrusion of the integrated circuit and the cavity cause the metal slug to align with the integrated circuit.

18. The portable computing device as recited in claim 15, further comprising a first heat sink disposed at a first end of the heat pipe and a second heat sink disposed at a second end of the heat pipe.

19. The portable computing device as recited in claim 15, wherein the beam spring comprises two stress concentrators that transmit the forces exerted by the beam spring to the metal slug.

* * * * *